(12) United States Patent
Myoung et al.

(10) Patent No.: US 7,084,098 B2
(45) Date of Patent: Aug. 1, 2006

(54) BROWN OXIDE PRETREATMENT COMPOSITION FOR CLEANING COPPER SURFACE AND IMPROVING ADHESION OF POLYIMIDE SURFACE, AND METHOD FOR IMPROVING ADHESION OF POLYIMIDE SURFACE BY APPLYING THE SAME TO BROWN OXIDE PROCESS

(75) Inventors: Bum-Young Myoung, Seoul (KR); Byoung-Ho Rhee, Dacjeon (KR); Yang-Je Lee, Chungchungbuk-do (KR); Dek-Gin Yang, Chungchungbuk-do (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 183 days.

(21) Appl. No.: 10/758,320

(22) Filed: Jan. 15, 2004

(65) Prior Publication Data
US 2005/0054548 A1    Mar. 10, 2005

(30) Foreign Application Priority Data
Sep. 5, 2003    (KR)    ............ 10-2003-0062235

(51) Int. Cl.
*C11D 7/32*    (2006.01)

(52) U.S. Cl. ............ 510/176; 510/175; 134/26

(58) Field of Classification Search ............ None
See application file for complete search history.

(56) References Cited

U.S. PATENT DOCUMENTS

| | | | |
|---|---|---|---|
| 4,276,186 A * | 6/1981 | Bakos et al. ............ 134/38 |
| 5,691,288 A | 11/1997 | Dhillon | |
| 5,977,041 A * | 11/1999 | Honda ............ 510/175 |
| 6,309,471 B1* | 10/2001 | Smith et al. ............ 134/28 |
| 2003/0148905 A1* | 8/2003 | Motson ............ 510/201 |

* cited by examiner

*Primary Examiner*—Gregory Webb
(74) *Attorney, Agent, or Firm*—Gottlieb, Rackman & Reisman, P.C.

(57) ABSTRACT

Disclosed herein are a brown oxide pretreatment composition for cleaning a copper surface and improving adhesion of a polyimide surface, and a method for improving adhesion of a polyimide surface by applying the composition to a brown oxide process. The brown oxide pretreatment composition for cleaning a copper surface and improving adhesion of a polyimide surface comprises, 5~15 g/L of an amine; 190~210 g/L of a hydroxide compound; at least one additive selected from 3~6 g/L of a cleaner adjuvant, 0.1~5 g/L of a antifoaming agent and 1~10 g/L of a precipitation inhibitor; and the balance of water. When the brown oxide pretreatment composition for cleaning a copper surface and improving adhesion of a polyimide surface is applied to a pretreatment step of a brown oxide process, it can clean a copper surface and improve adhesion of a polyimide surface.

8 Claims, No Drawings

US 7,084,098 B2

BROWN OXIDE PRETREATMENT COMPOSITION FOR CLEANING COPPER SURFACE AND IMPROVING ADHESION OF POLYIMIDE SURFACE, AND METHOD FOR IMPROVING ADHESION OF POLYIMIDE SURFACE BY APPLYING THE SAME TO BROWN OXIDE PROCESS

BACKGROUND OF THE INVENTION

1. Field of the Invention

The present invention relates to a brown oxide pretreatment composition for cleaning a copper surface and improving adhesion of a polyimide surface, and a method for improving adhesion of a polyimide surface by applying the composition to a brown oxide process. More particularly, the present invention relates to a composition which comprises an amine, a hydroxide compound, at least one additive selected from a cleaner adjuvant, a antifoaming agent and a precipitation inhibitor; and water wherein the amine and the hydroxide compound act to clean a copper surface and improve adhesion of a polyimide surface, and a method for improving adhesion of a polyimide surface using the composition as a pretreatment for a brown oxide process.

2. Description of the Related Art

Generally, in order to fabricate flexible printed circuit boards, methods for laminating or bonding a single- or double-sided flexible copper clad laminate (FCCL) using a prepreg (PPG) in which an epoxy resin is dipped, have been employed. Strong interfacial adhesion between layers is recognized as one of the most important factors in the final products.

Recently, in order to improve interfacial adhesion between a copper surface and a prepreg, many processes such as a process for forming a conversion coating on a copper surface have been developed. However, flexible PCBs have been fabricated without additional processes for improving interfacial adhesion between a polyimide surface and a prepreg. Thus, there exists a need for methods capable of improving interfacial adhesion between a polyimide surface and a prepreg.

Polyimide is a resin which exhibits excellent heat resistance, mechanical strength, electrical properties, etc., due to its rigid molecular structure. However, polyimide has a problem of delamination in the interface because of its low interfacial adhesion to an epoxy resin. This problem causes defects in the final products and deteriorates the reliability of final products. In particular, the interfacial adhesion is remarkably lowered after a thermal shock test such as a soldering test or hot oil test. Accordingly, improvement in the interfacial adhesion is thought to be a task to be solved for the development of high quality products. In this connection, many studies have been ongoing.

In the electronic device industries, with increasing demand for polyimide films, many processes have been developed. Such processes are largely divided into a dry etching process, a wet etching process and a process using a coupling agent, depending on the characteristics of these processes.

The dry etching process is advantageous in terms of its cleanness. The dry etching process is subdivided into plasma ($O_2$, Ar, $NH_3$), DBD (dielectric barrier discharge), IAR (ion assisted reaction) techniques, etc., which are economically disadvantageous in terms of high cost apparatuses and a low productivity. Advantages of the wet etching process include a relatively low production cost and a high productivity. In the process using a coupling agent, the coupling agent, for example APTMS (aminopropyltrimethoxysilane), improves interfacial adhesion.

Recently, special attention has been paid to the dry etching process owing to its cleanness. Specifically, the dry etching process can improve interfacial adhesion between a polyimide surface and a prepreg by passing a polyimide film through a high energy field under reduced pressure or normal pressure to remove weak boundary layers formed on the polyimide surface and form reactive functional groups. However, as described above, the dry etching process has problems in that high cost apparatuses are required and final products must be stored under stringent conditions for the protection of reactive functional groups formed after surface-treatment.

The wet etching process can improve interfacial adhesion by treating a polyimide surface with an aqueous alkali solution such as KOH (potassium hydroxide) or NaOH (sodium hydroxide) solution, or an amine such as TETA (triethylenetetraamine) or PEHA (pentaethylenehexamine), to make the polyimide surface hydrophilic, and at the same time, introduce reactive functional groups. Although many laboratory studies on the wet etching process have been undertaken, no attempts to apply the wet etching process to the fabrication processes of flexible printed circuit boards have been made because of some problems, for example, complex processes, moisture incorporation and poor reliability.

SUMMARY OF THE INVENTION

Therefore, the present invention has been made in view of the above problems, and it is an object of the present invention to provide a brown oxide pretreatment composition which can clean a copper surface and improve adhesion of a polyimide surface.

It is another object of the present invention to provide a method for improving adhesion of a polyimide surface by applying a brown oxide pretreatment composition of the present invention to a pretreatment step of the brown oxide process. The method can improve reliability of final products and simplify the fabrication process of flexible printed circuit boards. Accordingly, the method is labor-saving process and can induce low defects in final products.

It is to be understood that the brown oxide process as defined herein include a pretreatment step, a pre-dipping step, a conversion coating step, a water-washing step and a drying step.

The brown oxide pretreatment composition according to a present invention comprising an amine and a hydroxide compound as main components is used to remove oxidized films, oil stains and fingerprints left on a printed circuit board and to improve interfacial adhesion between a polyimide surface and a prepreg. Particularly, the composition of the present invention is used as a pretreatment in a brown oxide process for innerlayer circuits during fabricating flexible printed circuit boards (FPCBs) and multilayer printed circuit boards (MLBs), thereby cleaning a copper surface and improving adhesion of a polyimide surface.

When a flexible printed circuit board is treated with a conventional brown oxide pretreatment, a copper surface of the flexible printed circuit can be cleaned but no surface modification of a polyimide surface is exhibited. In contrast, when a flexible printed circuit board is treated with the brown oxide pretreatment composition according to the present invention, adhesion of a polyimide surface is improved by surface modification, as well as a copper surface is cleaned.

When the brown oxide pretreatment composition according to the present invention is applied to modify a polyimide surface, the amine and hydroxide compound contained in the composition facilitate the unwinding of polyimide rings to form a linear molecular structure. Accordingly, the linear molecular structure of the polyimide is bonded to a B step adhesive sheet under conditions of high pressure and high temperature to form secondary chemical bonds, and thus the excellent adhesion of the polyimide film can be attained.

The brown oxide pretreatment composition for cleaning a copper surface and improving adhesion of a polyimide surface according to the present invention comprises 5~15 g/L of an amine; 190~210 g/L of a hydroxide compound; at least one additive selected from 3~6 g/L of a cleaner adjuvant, 0.1~15 g/L of a antifoaming agent and 1~10 g/L of a precipitation inhibitor; and the balance of water.

In accordance with the present invention, the amine contained in the brown oxide pretreatment composition according to the present invention is present in an amount of 5~15 g/L, based on the total amount of the composition. When the content of the amine is less than 5 g/L, the effects of the amine are insufficiently exhibited. When the content of the amine exceeds 15 g/L, there is a risk of poor adhesion.

The amine is a hydroxy amine, and preferably selected from the group consisting of monoethanolamine (MEA), diethanolamine (DEA), triethanolamine (TEA), 2-aminoethanol, N,N-bis-2-hydroxypropylethanolamine, N-oleoylethanolamine and mixtures thereof.

The hydroxide compound is present in an amount of 190~210 g/L, based on the total amount of the brown oxide pretreatment composition. When the content of the hydroxide compound is less than 190 g/L, the ring-unwinding reaction of the polyimide is insufficient. When the content of the hydroxide compound exceeds 210 g/L, there is a risk of poor adhesion.

Preferably, the hydroxide compound is selected from the group consisting of metalhydroxides, e.g., sodium hydroxide (NaOH), potassium hydroxide (KOH), barium hydroxide (BaOH), ammoniumhydroxide, tetramethylammoniumhydroxide, tetraethylammoniumhydroxide, tetrapropylammoniumhydroxide and mixtures thereof.

In addition to these compounds mentioned above, the brown oxide pretreatment composition according to the present invention further comprises at least one additive selected from a cleaner adjuvant for increasing the solubility and surface tension of hydrophobic materials in water, a antifoaming agent for reducing foams in the form of a spray, and a precipitation inhibitor for increasing the solubility of water-insoluble materials, etc. The additives improve reactivity and reliability.

As the cleaner adjuvant, it is preferred to use one or more compounds selected from non-ionic surfactants, e.g., gluconic acid soda, polyglycol, ethoxylated fatty alcohol, polyethoxylated monoalkanolamide and EO/PO block copolymer.

The content of the cleaner adjuvant falls within the range of 3~6 g/L, based on the total amount of the composition. When the content of the cleaner adjuvant is less than 3 g/L, the cleaning effects of the cleaner adjuvant is insufficiently exhibited. When the content of the cleaner adjuvant exceeds 6 g/L, foams which cause poor workability are excessively formed.

As the antifoaming agent, it is preferred to use one or more compounds selected from anionic sufactrants, e.g., alkylphosphate, fatty acid sulfate, etc.

The content of the antifoaming agent is in the range of 0.1~5 g/L, based on the total amount of the composition. When the content of the antifoaming agent is less than 0.1 g/L, the foam-inhibiting effects of the antifoaming agent are insufficiently exhibited. When the content of the antifoaming agent exceeds 5 g/L, water-washability is poor.

As the precipitation inhibitor, it is preferred to use a polar solvent selected from the group consisting of N-methyl-2-pyrrolidone, N-cyclohexyl-2-pyrrolidone, 2-pyrrolidone, dimethylformamide, dimethyl acetamide, tetrahydrofuran, acetonitrile, dioxane, alcohol and mixtures thereof.

The content of the precipitation inhibitor is in the range of 1~10 g/L, based on the total amount of the composition. When the content of the precipitation inhibitor is less than 1 g/L, the precipitation inhibitor cannot affect the solubility of hydrophobic materials. When the content of the precipitation inhibitor exceeds 10 g/L, production costs are considerable.

Since the brown oxide pretreatment composition for cleaning a copper surface and improving adhesion of a polyimide surface according to the present invention comprises water as a balance component, the composition of the present invention is an aqueous solution.

There is provided a method for improving adhesion of a polyimide surface by applying the composition of the present invention to a brown oxide process, comprising the steps of: a) treating a printed circuit board with a brown oxide pretreatment composition; b) water-washing the printed circuit board of a); c) pre-dipping the printed circuit board of b); d) forming a conversion coating on the printed circuit board of c); e) water-washing the printed circuit board of d); and f) drying the printed circuit board of e).

When the brown oxide pretreatment composition for cleaning a copper surface and improving adhesion of a polyimide surface according to the present invention is applied to multilayer printed circuit boards and flexible printed circuit boards during a brown oxide process, excellent adhesion of a polyimide surface can be attained and a copper surface can be cleaned. Accordingly, a uniform conversion coating can be formed on the copper surface during conversion coating.

In order to clean a copper surface and modify a polyimide surface, the step of treating a printed circuit board with the brown oxide pretreatment composition of the present invention is preferably carried out by spraying the brown oxide pretreatment composition on the printed circuit board, or dipping the printed circuit board in the brown oxide pretreatment composition at 30~90° C. and preferably 40~70° C. for 10 seconds~10 minutes and preferably 10 seconds~6 minutes. When the treatment time is shorter than 10 seconds, the surface modification of a polyimide is poor. When the treatment time is longer than 10 minutes, the polyimide is excessively modified to form weak boundary layers on the polyimide surface, which causes poor interfacial adhesion between the polyimide surface and a prepreg.

The composition used in the step a) of treating a printed circuit board is the same as the brown oxide pretreatment composition for cleaning a copper surface and improving adhesion of a polyimide surface. Accordingly, a detailed description thereof is omitted.

After the treatment of a printed circuit board with the brown oxide pretreatment composition of the present invention, the water-washing step and the pre-dipping step are carried out.

The pre-dipping step is carried out by pre-dipping the printed circuit board in a pre-dipping composition. The pre-dipping composition has components similar to a conversion coating composition that will be explained below, but is more dilute than the conversion coating composition. The pre-dipping step activates a copper surface of the printed circuit board to facilitate an initial coating reaction and allow the formation of a uniform coating film on the copper surface. The pre-dipping step has functions of cleaning, conditioning, catalyzing and activating.

The pre-dipping composition used in the pre-dipping step is substantially the same as that disclosed in U.S. Pat. No. 6,475,299 and Korean Patent No. 328254, which comprises amino ethanol, an organic solvent, an organic acid, a nitrogen oxide, a silicon oxide and a reaction promoter. The pre-dipping step is carried out at about 10~60° C. for 10 seconds~10 minutes. As described above, the pre-dipping can activate the copper surface to facilitate an initial coating reaction. If the pre-dipping step is omitted, the formation of a conversion coating is delayed.

Following pre-dipping, the printed circuit board is preferably water-washed.

After the pre-dipping or water-washing is completed, a conversion coating step is carried out. The conversion coating step is carried out by spraying the conversion coating composition on the printed circuit board, or dipping the printed circuit board in the conversion coating composition at about 10~60° C. and preferably at 30~50° C. for 1~10 minutes and preferably 1~5 minutes. When the temperature is less than 10° C., the adhesion of the conversion coating is poor. When the temperature is higher than 60° C., the adhesive strength of the copper surface is poor.

The conversion coating composition used in the conversion coating step is substantially the same as that disclosed in U.S. Pat. No. 6,475,299 and Korean Patent No. 328254.

After a conversion coating is formed on the printed circuit board using the conversion coating composition, the printed circuit board is water-washed and dried to complete the brown oxide process of the printed circuit board.

The water-washing step is carried out in a three-step manner, the first step being hot-rinsing.

In the drying step, the printed circuit board is sufficiently dried at about 100° C. for about 30 minutes since moisture or air remaining on the board permits laminate voids to act as defects capable of expanding the board.

The method for improving adhesion of a polyimide surface using the brown oxide pretreatment composition according to facilitates formation of a conversion coating on a copper surface by cleaning the copper surface and increasing the adhesion between a polyimide surface and a prepreg by modifying the polyimide surface.

DESCRIPTION OF THE PREFERRED EMBODIMENTS

The present invention will now be described in more detail with reference to the following examples. However, these examples are not to be construed as limiting the scope of the invention.

EXAMPLE 1

A brown oxide pretreatment composition was prepared to have a composition shown in Table 1 below. A flexible copper and a laminate core specimen were cleaned with the composition at 65° C. for 1 minute, and then pre-dipped in a pre-dipping composition. The flexible copper and the laminate core specimen were dipped in a conversion coating composition prepared as shown in Table 2 below for 2 minutes to subject to conversion coating. At this time, the conversion coating composition was stirred at a speed of about 0.1 m/sec. After the conversion coating step, the flexible copper and the laminate core specimen were dried at 100° C. for 30 minutes, and then laminated to each other under the following conditions.

<Lamination Conditions>
Two 1080 B step adhesive sheets (polyfunctional epoxy resin having a $T_g$ of 140° C.)

| | |
|---|---|
| Pressure | 180 PSI |
| Temperature | 175° C. |
| Time | 60 min. |

EXAMPLE 2

The procedure of Example 1 was repeated, except that the pretreatment with the brown oxide pretreatment composition was carried out for 3 minutes.

EXAMPLE 3

The procedure of Example 1 was repeated, except that the pretreatment with the brown oxide pretreatment composition was carried out for 5 minutes.

EXAMPLE 4

The procedure of Example 1 was repeated, except that the pretreatment with the brown oxide pretreatment composition was carried out at 45° C.

EXAMPLE 5

The procedure of Example 4 was repeated, except that the pretreatment with the brown oxide pretreatment composition was carried out for 3 minutes.

EXAMPLE 6

The procedure of Example 4 was repeated, except that the pretreatment with the brown oxide pretreatment composition was carried out for 5 minutes.

EXAMPLE 7

The procedure of Example 1 was repeated, except that the pretreatment with the brown oxide pretreatment composition was carried out at 80° C.

EXAMPLE 8

The procedure of Example 7 was repeated, except that the pretreatment with the brown oxide pretreatment composition was carried out for 3 minutes.

EXAMPLE 9

The procedure of Example 7 was repeated, except that the pretreatment with the brown oxide pretreatment composition was carried out for 5 minutes.

COMPARATIVE EXAMPLE

The procedure of Example 1 was repeated, except that a commercially available alkali cleaner (HD-250™) was used as a brown oxide pretreatment composition.

TABLE 1

Brown oxide pretreatment composition

| Components | Compositional ratios |
|---|---|
| Monoethanolamine | 10 g/l |
| Triethanolamine | 5 g/l |
| Tetramethylammoniumhydroxide | 200 g/l |
| Gluconic acid soda | 4 g/l |
| Water | Balance |

TABLE 2

Conversion coating composition

| Components | Compositional ratios |
|---|---|
| Sulfuric acid(98%) | 92 g/l |
| Phosphoric acid(70%) | 14 g/l |
| Citric acid | 18 g/l |
| Hydrogen peroxide (35%) | 45 g/l |
| 2-imidazolidinone | 60 g/l |
| 1H benzotriazole | 50 g/l |
| Sodium silicate | 5 g/l |

TABLE 2-continued

Conversion coating composition

| Components | Compositional ratios |
|---|---|
| Pyrogallol | 15 g/l |
| 2-pyrrolidone | 0.05 g/l |
| DPTA-5Na | 2 g/l |
| Water | Balance |

TABLE 3

Composition of alkali cleaner (HD-250 ™)

| Components | Compositional ratios |
|---|---|
| Monoethanolamine | 10 g/l |
| Triethanolamine | 5 g/l |
| N-methyl-2-pyrrolidone | 0.04 g/l |
| Citric acid soda | 3 g/l |
| Water | Balance |

TABLE 4

Results

| | Example 1 | Example 2 | Example 3 | Example 4 |
|---|---|---|---|---|
| Appearance of copper surface | Dark brown | Dark brown | Dark brown | Dark brown |
| Appearance of polyimide surface | Color intensity increased | Color intensity increased | Color intensity increased | Color intensity increased |
| Adhesive strength of copper surface | 0.68 kgf/cm$^2$ | 0.62 kgf/cm$^2$ | 0.58 kgf/cm$^2$ | 0.64 kgf/cm$^2$ |
| Adhesive strength of polyimide surface | >1.25 kgf/cm$^2$ | >1.25 kgf/cm$^2$ | >1.25 kgf/cm$^2$ | >1.25 kgf/cm$^2$ |
| Thermally shocked copper surface — Laminate delamination | Not observed | Not observed | Not observed | Not observed |
| Thermally shocked copper surface — Laminate damages | Not observed | Not observed | Not observed | Not observed |
| Thermally shocked polyimide surface — Laminate delamination | Not observed | Not observed | Not observed | Not observed |
| Thermally shocked polyimide surface — Laminate damages | Not observed | Not observed | Not observed | Not observed |

| | Example 5 | Example 6 | Example 7 | Example 8 |
|---|---|---|---|---|
| Appearance of copper surface | Dark brown | Dark brown | Dark brown | Dark brown |
| Appearance of polyimide surface | Color intensity increased | Color intensity increased | Color intensity increased | Color intensity increased |
| Adhesive strength of copper surface | 0.59 kgf/cm$^2$ | 0.56 kgf/cm$^2$ | 0.65 kgf/cm$^2$ | 0.59 kgf/cm$^2$ |
| Adhesive strength of polyimide surface | >1.25 kgf/cm$^2$ | >1.25 kgf/cm$^2$ | >1.25 kgf/cm$^2$ | >1.25 kgf/cm$^2$ |
| Thermally shocked copper surface — Laminate delamination | Not observed | Not observed | Not observed | Not observed |
| Thermally shocked copper surface — Laminate damages | Not observed | Not observed | Not observed | Not observed |
| Thermally shocked polyimide surface — Laminate delamination | Not observed | Not observed | Not observed | Not observed |
| Thermally shocked polyimide surface — Laminate damages | Not observed | Not observed | Not observed | Not observed |

TABLE 4-continued

Results

| | | Example 9 | Comparative Example |
|---|---|---|---|
| Appearance of copper surface | | Dark brown | Dark brown |
| Appearance of polyimide surface | | Color intensity increased | No change |
| Adhesive strength of copper surface | | 0.57 kgf/cm$^2$ | 0.69 kgf/cm$^2$ |
| Adhesive strength of polyimde surface | | >1.25 kgf/cm$^2$ | 0.32 kgf/cm$^2$ |
| Thermally shocked copper surface | Laminate delamination | Not observed | Not observed |
| | Laminate damages | Not observed | Not observed |
| Thermally shocked polyimide surface | Laminate delamination | Not observed | Observed |
| | Laminate damages | Not observed | Observed |

*Adhesive strength (Peel strength): After a 1 cm wide specimen was fixed to a tensile strength tester, an adhesive strength was measured at an angle of 90° and a speed of 50 mm/min.
*Thermal shock (Solder shock):
260° C., 20seconds 1 cycle, dipping
288° C., 10 seconds 1 cycle, surface-contact
*1.25 kgf/cm$^2$ refers to a peeling strength of FCCL.

Results obtained from Examples 1~9 and Comparative Example are explained below.

In the case of Examples 1~9 in which the brown oxide pretreatment composition of the present invention was used, the adhesive strengths of the polyimide surface were measured to be above 1.25 kgf/cm$^2$. Considering the fact that polyimide and copper of FCCL were peeled at an adhesive strength of 1.25 kgf/cm$^2$ when measuring interfacial adhesion between the polyimide and a prepreg, it is determined that the results obtained from Examples 1~9 are preferred. When the adhesive strength of the polyimide surface in Example 1~9 and the adhesive strength (0.32 kgf/cm$^2$) in Comparative Example were compared, the adhesive strength measured in the cases (Example 1~9) using the brown oxide pretreatment composition of the present invention were about four times higher than that of the adhesive strength measured in the case (Comparative Example) using a commercially available pretreatment composition (HD-250™).

In terms of the adhesive strength of the copper surface, Example 1 and Comparative Example carried out at the same pretreatment temperature (65° C.) for the same pretreatment time (1 min.) exhibited comparable adhesive strengths of 0.68 kgf/cm$^2$ and 0.69 kgf/cm$^2$, respectively. In contrast, Examples 5 and 6 carried out at a relatively low pretreatment temperature for a relatively long pretreatment time, and Examples 8 and 9 carried out at a relatively high temperature for a relatively long pretreatment time exhibited a relatively low adhesive strength of the copper surface.

As can be seen from these results, since the brown oxide pretreatment composition of the present invention exhibits excellent effects in the surface treatment of polyimide, compared to the conventional pretreatment composition, it can improve adhesion between polyimide and a prepreg. In addition, in the case that the pretreatment was carried out at 65° C. for 1 minute, the adhesive strength of the copper surface was similar to those of prior arts.

Meanwhile, in the case of Examples 1~9, no laminate delamination and laminate damages were observed in both a thermally shocked copper surface and a thermally shocked polyimide surface. In the case of Comparative Example, no laminate delamination and laminate damages were observed in a thermally shocked copper surface, but some laminate delamination and laminate damages were observed in a thermally shocked polyimide surface.

That is, the brown oxide pretreatment composition of the present invention can improve the adhesion between polyimide surface and a prepreg, and inhibit the occurrence of laminate delamination and laminate damages upon thermal shock.

In conclusion, in order to impart excellent adhesion to both the polyimide surface and the copper surface, it is preferred that the treatment of the flexible copper and the laminate core specimen with the brown oxide pretreatment composition of the present invention is carried out at 65° C. and 1 minute.

As apparent from the above description, the brown oxide pretreatment composition according to the present invention can clean a copper surface and improve adhesion of a polyimide surface.

In addition, the brown oxide pretreatment composition use in a pretreatment step of a brown oxide process. As a result, the pretreatment step can function as a cleaning step of printed circuit boards and a surface-treatment step for improving adhesion of a polyimide surface. Accordingly, when laminating a single- or double-sided flexible copper clad laminate(FCCL), excellent adhesion and high reliability of the copper and polyimide can be provided. Furthermore, since the brown oxide pretreatment composition simplifies the fabrication process of flexible printed circuit boards, it can reduce labor costs and defects in final products.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for improving adhesion of a polyimide surface by applying the brown oxide pretreatment composition to a brown oxide process, comprising the steps of:

a) treating a printed circuit board with a brown oxide pretreatment composition for cleaning a copper surface and improving adhesion of a polyimide surface;
b) water-washing the printed circuit board of a);
c) pre-dipping the printed circuit board of b);
d) forming a conversion coating on the printed circuit board of c);
e) water-washing the printed circuit board of d); and
f) drying the printed circuit board of e);

wherein the brown oxide pretreatment composition for cleaning a copper surface and improving adhesion of a polyimide surface used in step a) comprises:
5–15 g/L of a hydroxylamine:
190–210 g/L of a hydroxide compound:
at least one additive selected from 3–6 g/L of a cleaner adjuvant, 0.1–5 g/L of an antifoaming agent and 1–10 g/L of a precipitation inhibitor; and
the balance of water.

2. A method for improving adhesion of a polyimide surface by applying the brown oxide pretreatment composition to a brown oxide process according to claim 1, further comprising a water-washing step following the pre-dipping step.

3. A method for improving adhesion of a polyimide surface by applying the brown oxide pretreatment composition to a brown oxide process according to claim 1, wherein the step a) of treating a printed circuit board with a brown oxide pretreatment composition is carried out at 30–90° C. for 10 seconds–10 minutes.

4. A method for improving adhesion of a polyimide surface by applying the brown oxide pretreatment composition to a brown oxide process according to claim 1, wherein the hydroxylamine is selected from the group consisting of monoethanolamine (MEA), diethanolamine (DEA), triethanolamine (TEA), 2-aminoethanol, N,N-bis-2-hydroxypropylethanolamine, N-oleoylethanolamine and mixtures thereof.

5. A method for improving adhesion of a polyimide surface by applying the brown oxide pretreatment composition to a brown oxide process according to claim 1, wherein the hydroxide compound is selected from the group consisting of sodium hydroxide (NaOH), potassium hydroxide (KOH), barium hydroxide (BaOH), ammonium hydroxide, tetramethylammoniumhydroxide, tetraethylammoniumhydroxide, tetrapropylammoniumhydroxide and mixtures thereof.

6. A method for improving adhesion of a polyimide surface by applying the brown oxide pretreatment composition to a brown oxide process according to claim 1, wherein the cleaner adjuvant is at least one compound selected from the group consisting of gluconic acid soda, polyglycol, ethoxylated fatty alcohol, polyethoxylated monoalkanolamide, EO/PO block copolymer and mixtures thereof.

7. A method for improving adhesion of a polyimide surface by applying the brown oxide pretreatment composition to a brown oxide process according to claim 1, wherein the antifoaming agent is an alkylphosphate or fatty acid sulfate.

8. A method for improving adhesion of a polyimide surface by applying the brown oxide pretreatment composition to a brown oxide process according to claim 1, wherein the precipitation inhibitor is selected from the group consisting of N-methyl-2-pyrrolidone, N-cyclohexyl-2-pyrrolidone, 2-pyrrolidone, dimethylformamide, dimethyl acetamide, tetrahydrofuran, acetonitrile, dioxane, alcohol and mixtures thereof.

* * * * *